(12) United States Patent
Molina

(10) Patent No.: US 7,375,599 B2
(45) Date of Patent: May 20, 2008

(54) ANALOG CIRCUIT AND METHOD FOR MULTIPLYING CLOCK FREQUENCY

(75) Inventor: Johnnie Molina, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 169 days.

(21) Appl. No.: 11/448,380

(22) Filed: Jun. 6, 2006

(65) Prior Publication Data

US 2007/0279137 A1    Dec. 6, 2007

(51) Int. Cl.
*H03K 3/037* (2006.01)
*H03K 3/233* (2006.01)

(52) U.S. Cl. .................. 331/143; 331/111; 331/74; 327/120; 327/122

(58) Field of Classification Search .............. 331/111, 331/113 R, 143, 144, 74; 327/119, 122
See application file for complete search history.

(56) References Cited

U.S. PATENT DOCUMENTS 5,180,994 A * 1/1993 Martin et al. ................ 331/38

* cited by examiner

*Primary Examiner*—Robert J. Pascal
*Assistant Examiner*—James Goodley
(74) *Attorney, Agent, or Firm*—Wade J. Brady, III; Frederick J. Telecky, Jr.

(57) ABSTRACT

A signal generating circuit includes a relaxation oscillator operating to alternately generate a first ramp signal that is periodic at a frequency of the relaxation oscillator and a second ramp signal that is periodic at the frequency of the relaxation oscillator and is out of phase with respect to the first ramp signal The first ramp signal is compared to a first reference voltage and the state of a first flip-flop is changed if the first ramp signal exceeds the first reference voltage. The second ramp signal is compared to the first reference voltage and the state of a second flip-flop is changed if the second ramp signal exceeds the first reference voltage. The first flip-flop is reset in response to a first level of the first ramp signal and the second flip-flop is reset in response to a second level of the second ramp signal. A logical ORing function is performed on an output of the first flip-flop and an output of the second flip-flop to produce an output signal having a frequency that is a multiple of the relaxation oscillator frequency.

20 Claims, 5 Drawing Sheets

ANALOG CIRCUIT AND METHOD FOR MULTIPLYING CLOCK FREQUENCY

BACKGROUND OF THE INVENTION

The present invention relates generally to improved circuits and methods for generating clock signals by multiplying a fundamental clock frequency, and more particularly to substantially increasing the accuracy of the multiplied clock frequency above the accuracy achievable in the prior art.

"Prior Art" FIG. 1 shows a clock generation circuit 1 which includes a typical relaxation oscillator 2 that is believed to be representative of the closest prior art. Relatively "tight" frequency specifications are required for some integrated circuits including internal clock generators based on internal relaxation oscillators. For example, relatively tight frequency specifications are required for internal clock signals in integrated circuits which are designed to communicate over an RS232 interface. In the manufacture of such an integrated circuit, it may be desirable to perform a laser trimming operation on certain resistors in the integrated circuit at room temperature to produce a desired relaxation oscillator frequency. However, after the laser trimming operation the relaxation oscillator frequency nevertheless may vary significantly over a specified temperature range (e.g., minus 50 degrees Centigrade to plus 125 degrees Centigrade). There may be a need to ensure that the laser trimming operation at room temperature results in the relaxation oscillator frequency being within the specified range over the entire allowable temperature range. This has been difficult to achieve for internal clock generation circuits based on prior art relaxation oscillator circuits.

Referring to FIG. 1, clock generator circuit 1 includes a relaxation oscillator 2 including a current source 11 which supplies a current I1 to the sources of P-channel transistors M1 and M2, the gates of which are controlled by a logic circuit 10. The drain of transistor M1 is connected by conductor 3 to capacitor C1, switch S2, and a comparator 13. The drain of transistor M2 is connected to capacitor C2, switch S1, and comparator 12. Comparators 12 and 13 receive a reference voltage Vref that is produced by a current source Iref flowing through a resistor having a resistance R1.

The outputs of comparators 12 and 13 are connected to inputs of an OR gate 14, the output of which clocks a flip-flop 15. The output 16 of flip-flop 15 is connected to the inputs of a inverter 18 and a non-inverting buffer 20 and to an input of logic circuit 10. Logic circuit 10 produces clock signals $\phi1$, $\phi2$, $\overline{\phi1}$, and $\overline{\phi2}$ in response to the signal produced by flip-flop 15, where $\phi2$ can be equal to $\overline{\phi1}$ and $\phi1$ can be equal to $\overline{\phi2}$.

If transistor M1 is on, transistor M2 is off, switch S1 is closed, and switch S2 is open, causing the current I1 to flow through transistor M1 and gradually charge up capacitor C1, producing the ramp section "A1" of V3 as shown during which the clock signal CLK in the timing diagram of FIG. 2 is at the level P1. When V3 exceeds reference voltage Vref, the output 36 of comparator 12 switches from a "0" level to a "1" level after a propagation delay Tprop, causing a "1" level to be produced at the output of OR gate 14. This causes flip-flop 15 to change state, causing buffer 20 to produce the low level N1 of clock signal CLK in FIG. 2 and causing logic circuit 10 to switch $\phi1$ to a high level and to switch $\phi2$ to a low level That turns transistor M1 off, turns transistor M2 on, closes switch S2, and opens switch S1. The closing of switch S2 discharges capacitor C1, producing transition B1 of voltage signal V3. The current I1 flows through transistor M2 and gradually charges up capacitor C2, producing the ramp section "A2" of signal V4. The operation continues similarly to that described above, and when V4 exceeds reference voltage Vref, the output 37 of comparator 13 switches from a "0" level to a "1" level, and a "1" level then produced at the output of OR gate 14 causes flip-flop 15 to change state, reversing the levels of $\phi1$ and $\phi2$. This discharges capacitor C2 to ground, causing transition "B2" of voltage signal V4 and also causing the transition of clock signal CLK to the level P2. As the foregoing operation is repeated, the level of CLK changes and the levels of $\phi1$ and $\phi2$ change each time the ramp portions of V3 and V4 exceed Vref.

The period of oscillation $T_{OSC}$ of relaxation oscillator 2 is given by the expression $$T_{OSC} = (2*C*V\text{ref})/I1 + T\text{prop}. \quad \text{Eq. (1)}$$

The value of Tprop has a great influence on the ability of relaxation oscillator 2 to operate at very high clock frequencies (e.g., several hundred megahertz) over a typical expected temperature range (e.g., −50 degrees Centigrade to +125 degrees Centigrade) because Tprop can vary significantly over that range.

For clock signal periods requiring an accuracy of less than, for example 2%, over a predetermined typical temperature range and power supply range, the variance of the propagation delay Tprop can limit the maximum clock frequency obtainable. For example, a deviation of 1 nanosecond in Tprop can produce a corresponding 1% deviation in a 10 MHz nominal frequency of relaxation oscillator 2 and hence in the frequency of CLK. However, since the propagation delay Tprop is not totally dependent on the frequency of relaxation oscillator 2, if in this example relaxation oscillator 2 oscillates at a frequency higher than 10 MHz, any deviation of the propagation delay Tprop over the expected temperature range results in a correspondingly greater percentage deviation than 1% in the corresponding period of relaxation oscillator 2.

Thus, there is an unmet need for a clock generator circuit based on a relaxation oscillator that provides increased accuracy of the generated clock signal.

There also is an unmet need for a circuit and technique for multiplying the frequency of a signal produced by a relaxation oscillator without having to increase the current supplied by a current source in the relaxation oscillator or varying the value of capacitors such as capacitors C1 and C2 in FIG. 1.

There also is an unmet need for a circuit and technique for multiplying the frequency of a signal based on a clock signal derived from a relaxation oscillator without having to increase the frequency of the relaxation oscillator.

There also is an unmet need for an analog technique and circuit for multiplying an output signal produced by a relaxation oscillator to obtain a signal having a frequency which is a multiple of the frequency of the output signal produced by the relaxation oscillator without reducing overall circuit performance of the relaxation oscillator and the analog multiplying circuit over an expected temperature range.

There also is an unmet need for an analog technique and circuit for multiplying an output signal produced by a relaxation oscillator to obtain a signal having a frequency which is a multiple of the frequency of the output signal produced by the relaxation oscillator without unacceptably limiting the maximum achievable frequency of the multiplied output signal.

There also is an unmet need for an analog technique for obtaining signals within certain phase specifications or time delay specifications of a fundamental relaxation oscillator output.

SUMMARY OF THE INVENTION

It is an object of the invention to provide a clock generator circuit based on a relaxation oscillator that provides increased accuracy of the generated clock signal.

It is another object of the invention to provide a circuit and technique for multiplying the frequency of a signal produced by a relaxation oscillator without having to increase the current supplied by a current source in the relaxation oscillator.

It is another object of the invention to provide an analog technique for obtaining signals within certain phase specifications or time delay specifications of a fundamental relaxation oscillator output.

It is another object of the invention to provide a circuit and technique for multiplying the frequency of a signal based on a clock signal derived from a relaxation oscillator without having to increase the frequency of the relaxation oscillator.

It is another object of the invention to provide an analog technique and circuit for multiplying an output signal produced by a relaxation oscillator to obtain a signal having a frequency which is a multiple of the frequency of the output signal produced by the relaxation oscillator without reducing overall circuit performance of the relaxation oscillator and the analog multiplying circuit over an expected temperature range.

It is another object of the invention to provide an analog technique and circuit for multiplying an output signal produced by a relaxation oscillator to obtain a signal having a frequency which is a multiple of the frequency of the output signal produced by the relaxation oscillator without unacceptably limiting the maximum achievable frequency of the multiplied output signal.

Briefly described, and in accordance with one embodiment, the present invention provides a signal generating circuit including a relaxation oscillator (2) operating to alternately generate a first ramp signal (V3) that is periodic at a frequency of the relaxation oscillator and a second ramp signal (V4) that is periodic at the frequency of the relaxation oscillator and is out of phase with respect to the first ramp signal (V3). The first ramp signal is compared to a first reference voltage (Vref/2) and the state of a first flip-flop (31) is changed if the first ramp signal exceeds the first reference voltage. The second ramp signal (V4) is compared to the first reference voltage and the state of a second flip-flop (30) is changed if the second ramp signal (V4) exceeds the first reference voltage. The first flip-flop (31) is reset in response to a first level of the first ramp signal (V3) and the second flip-flop (30) is reset in response to a second level of the second ramp signal (V4). A logical ORing function is performed on an output of the first flip-flop and an output of the second flip-flop to produce an output signal having a frequency that is a multiple of the relaxation oscillator frequency.

In one embodiment, the invention provides a signal generating circuit (100) including a relaxation oscillator (2) having switching circuitry (M1,M2,S1,S2) operative to alternately generate a first ramp signal (V3) that is periodic at a frequency of the relaxation oscillator and a second ramp signal (V4) that is periodic at the frequency of the relaxation oscillator and is out of phase with respect to the first ramp signal (V3) and an analog multiplier circuit (50) including a first comparator (26 or 53) having a first input coupled to receive the first ramp signal (V3) and a second input coupled to receive a first reference voltage (Vref/2 or Vref/4). A second comparator (27 or 54) has a first input coupled to receive the second ramp signal (V4) and a second input coupled to receive the first reference voltage (Vref/2). A first flip-flop (31 or 55) has a clock input coupled to an output of the first comparator (26), and a second flip-flop (30 or 56) has a clock input coupled to an output of the second comparator (27). First reset circuitry (12,21 or 12A,21A) resets the first flip-flop (31) in response to a first level of the first ramp signal (V3) and second reset circuitry (13,22 or 13A,22A) resets the second flip-flop (30) in response to a second level of the second ramp signal (V4). A gate circuit (34 or 57) performs a logical ORing function on an output of the first flip-flop (31) and an output of the second flip-flop (30) to produce an output signal (CLK×2 or CLK×4) that is periodic at a frequency that is a multiple of the frequency of the relaxation oscillator. In a described embodiment, the relaxation oscillator includes a third comparator (13) and a fourth comparator (12) each having an input coupled to receive a second reference voltage (Vref), the third comparator (13) having another input coupled to receive the first ramp signal (V3) and an output coupled to logic circuitry (14,15,10) for controlling the switching circuitry (M1,M2, S1,S2), the fourth comparator (12) having another input coupled to receive the second ramp signal (V4) and an output coupled to the logic circuitry (14,15,10), the first reset circuitry including the third comparator (13), the output of the third comparator (13) being coupled to a reset input of the first flip-flop (31), the second reset circuitry including the fourth comparator (12), the output of the fourth comparator (12) being coupled to a reset input of the second flip-flop (30). The output of the third comparator (13) can be coupled to the reset input of the first flip-flop (31) by means of a first inverter (21), and the output of the fourth comparator (12) can be coupled to the reset input of the second flip-flop (30) by means of a second inverter (22). The first (31) and second (30) flip-flops are D-type flip-flops each having a reset input, and an output of the first inverter (21) is connected to the reset input of the first flip-flop (31) and an output of the second inverter (22) is connected to the reset input of the second first flip-flop (30).

In the described embodiments, the relaxation oscillator (2) includes first (M1) and second (M2) switching transistors each having a source coupled to a current source (I1), a drain of the first switching transistor (M1) being coupled to a first conductor (3) conducting the first ramp signal (V3), and a drain of the second switching transistor (M2) being coupled to a second conductor (4) conducting the second ramp signal (V4). The logic circuitry (14,15,10) produces first ($\phi$1) and second ($\phi$2) control signals which are out of phase with respect to each other, a gate of the first switching transistor (M1) being coupled to receive the first control signal ($\phi$1), a gate of the second switching transistor (M1) being coupled to receive the second control signal ($\phi$2). The relaxation oscillator (2) includes a first switch (S2) coupled between the first conductor (3) and a reference voltage conductor (GND) and a second switch (S1) coupled between the second conductor (4) and the reference voltage conductor, and the logic circuitry (14,15,10) produces first ($\overline{\phi1}$) and second ($\overline{\phi2}$) logical complement control signals which are logical complements of the first ($\phi$1) and second ($\phi$2) control signals, respectively, a control electrode of the first switch (S2) being coupled to receive the second logical complement signal ($\overline{\phi1}$), and a control electrode of the second switch (S1) being coupled to receive the second logical complement control signal ($\overline{\phi 2}$).

In the described embodiments, the signal generating circuit is an integrated circuit, wherein the current source (I1) includes a bandgap circuit (43) having an output coupled to one input of a first operational amplifier (44), an output of the first operational amplifier (44) being coupled to a gate of a first transistor (M3) having a having a source coupled to another input of the first operational amplifier (44) and to one terminal of an external resistor ($R_{EXT}$) having another terminal coupled to the reference voltage conductor (GND), a drain of the first transistor (M3) being coupled to an analog input of a first current digital-to-analog converter (45), an output of which produces the current supplied by the current source (I1). A reference voltage circuit (Iref,47,48) includes a reference current source (Iref), a first resistor (47) having a first terminal coupled by a first reference voltage conductor (5) to a terminal of the reference current source (Iref), and a second resistor (48) having a first terminal coupled by a second reference voltage conductor (24) to a second terminal of the first resistor (47) and a second terminal coupled to the reference voltage conductor (GND), the first reference voltage conductor (5) conducting the second reference voltage conductor (Vref), the second reference voltage conductor (24) conducting the first reference voltage (Vref/2). The reference current source (Iref) includes another bandgap circuit (43) having an output coupled to one input of a second operational amplifier (44), an output of the second operational amplifier (44) being coupled to a gate of a second transistor (M3) having a source coupled to another input of the second operational amplifier (44) and to one terminal of an internal resistor ($R_{INT}$) having another terminal coupled to the reference voltage conductor (GND), a drain of the second transistor (M3) being coupled to an analog input of a second current digital-to-analog converter (45), an output of which produces the current supplied by the reference current source (Iref).

In a described embodiment, the analog multiplier circuit (50) also includes a third comparator (54) having a first input coupled to receive the first ramp signal (V3) and a second input coupled to receive a third reference voltage (Vref/4) and a fourth comparator (53) having a first input coupled to receive the second ramp signal (V4) and a second input coupled to receive the third reference voltage (Vref/4). A third flip-flop (56) has a clock input coupled to an output of the third comparator (54), and a fourth flip-flop (55) has a clock input coupled to an output of the fourth comparator (53). Third reset circuitry resets the third flip-flop (56) in response to a third level of the first ramp signal (V3) and fourth reset circuitry resets the fourth flip-flop (55) in response to a fourth level of the second ramp signal (V4). The gate circuit (57) also performs the logical ORing function on an output of the third flip-flop (56) and an output of the fourth flip-flop (55) to produce an output signal (CLK×4) that is periodic at a frequency that is 4 times the frequency of the relaxation oscillator.

In one embodiment, a signal generating circuit (100) includes a relaxation oscillator (2) operating to alternately generate a first ramp signal (V3) that is periodic at a frequency of the relaxation oscillator and a second ramp signal (V4) that is periodic at the frequency of the relaxation oscillator and is out of phase with respect to the first ramp signal (V3), means for comparing the first ramp signal (V3) to a first reference voltage (Vref/2), means for changing the state of a first flip-flop (31) if the first ramp signal (V3) exceeds the first reference voltage (Vref/2), means for comparing the second ramp signal (V4) to the first reference voltage (Vref/2), means for changing the state of a second flip-flop (30) if the second ramp signal (V4) exceeds the first reference voltage (Vref/2), means for resetting the first flip-flop (31) in response to a first level of the first ramp signal (V3) and means for resetting the second flip-flop (30) in response to a second level of the second ramp signal (V4), and means for performing a logical ORing function on an output of the first flip-flop (31) and an output of the second flip-flop (30) to produce an output signal (CLK×2 or CLK×4) that is periodic at a frequency that is a multiple of the frequency of the relaxation oscillator.

DETAILED DESCRIPTION OF THE PREFERRED EMBODIMENTS

Figure 1:
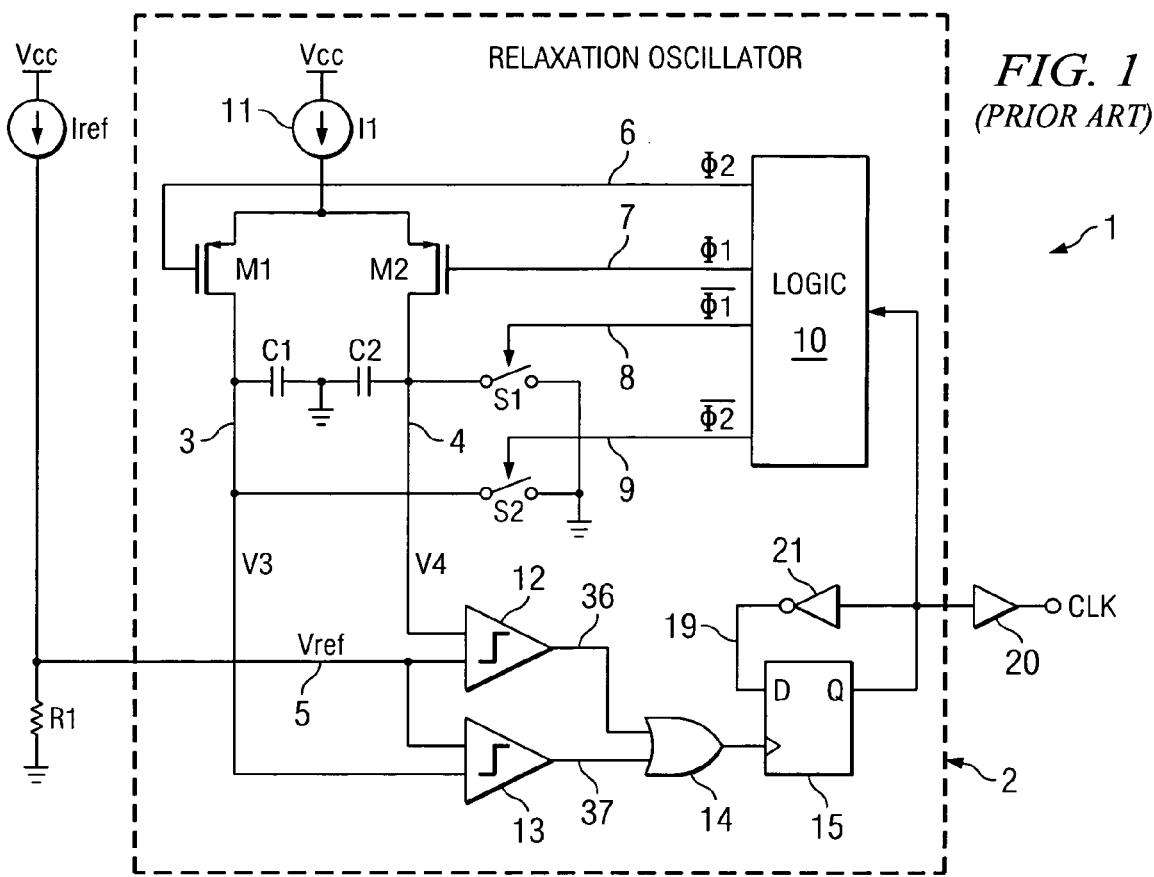
FIG. 1 is a block diagram of a prior art clock signal generator circuit including a relaxation oscillator.
Figure 2:
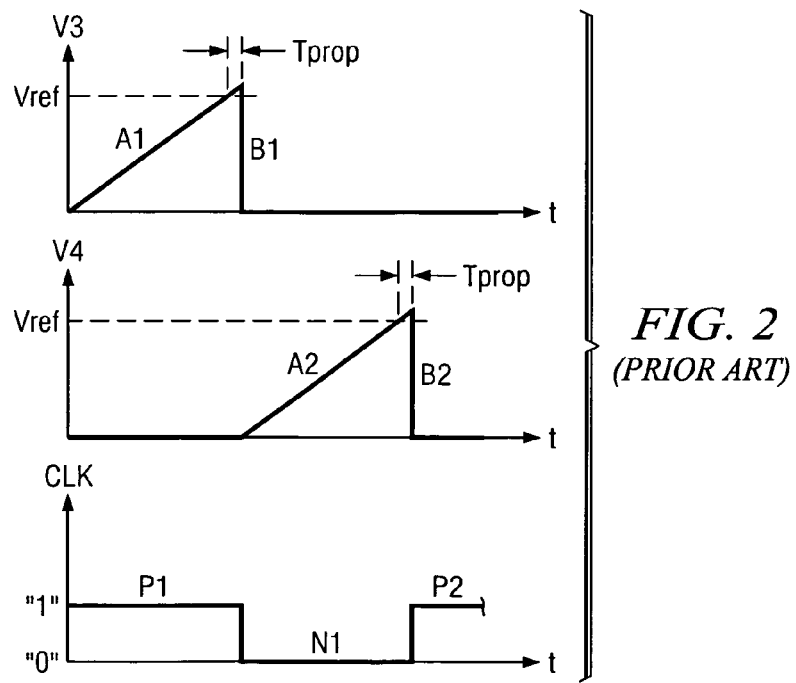
FIG. 2 is a diagram useful for explaining the operation and shortcomings of the prior art clock signal generating circuit of FIG. 1.
Figure 3:
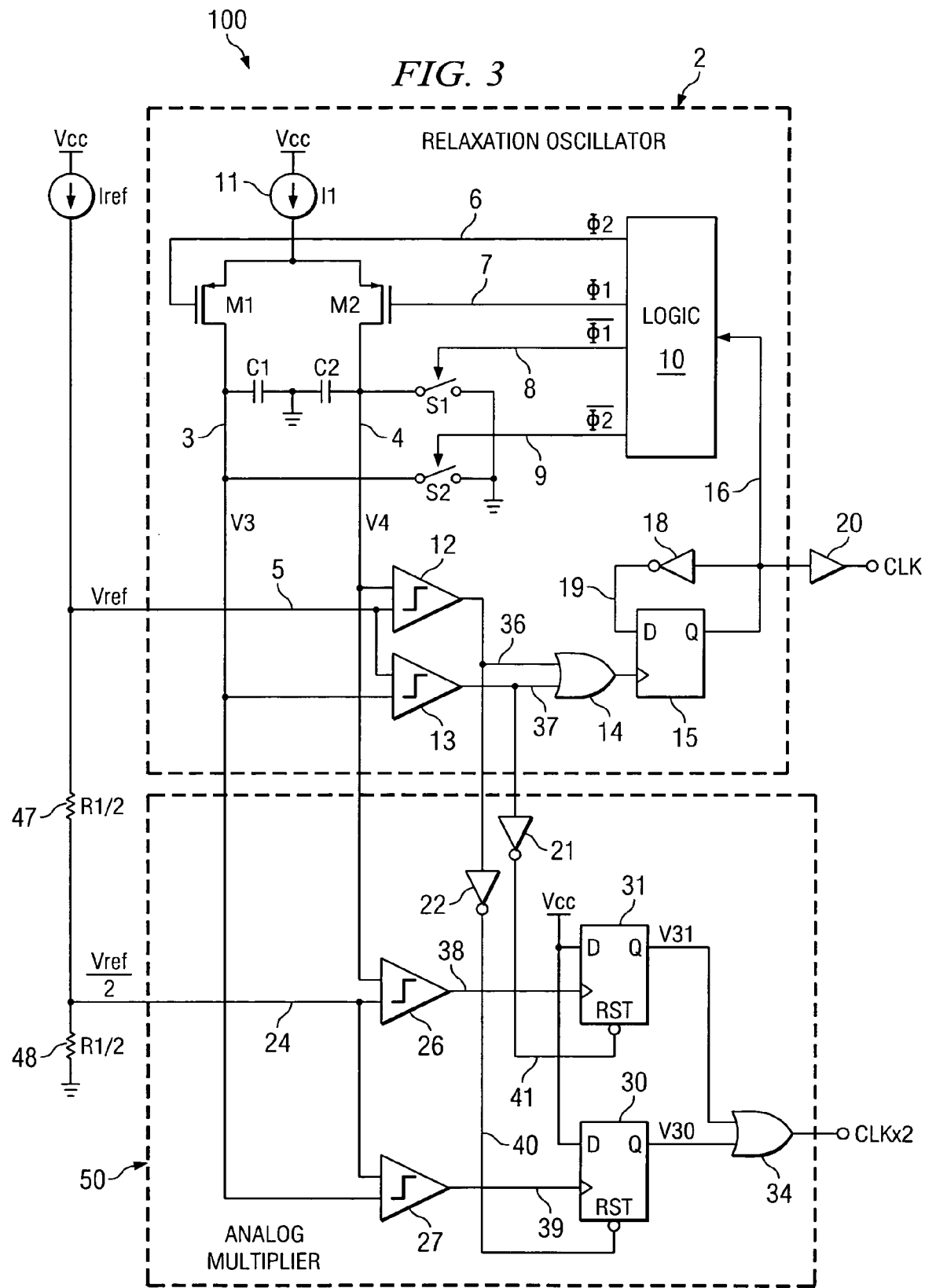
FIG. 3 is a block diagram of a clock signal generator circuit which produces a clock output signal having a frequency 2 times the relaxation oscillator frequency.

Referring to FIG. 3, clock generator circuit 100 includes a relaxation oscillator 2 which is the same as the one shown FIG. 1. Clock generator circuit 100 also includes an analog multiplier circuit 50 that generates a clock signal CLK×2 which has twice the relaxation oscillator frequency wherein the accuracy of the frequency of CLK×2 is substantially greater than would be the case if CLK×2 were generated by simply doubling the frequency of relaxation oscillator 2.

Relaxation oscillator 2 includes a current source 11 that supplies a current I1 to the sources of P-channel transistors M1 and M2, the gates of which are coupled by conductors 6 and 7, respectively, to outputs of logic circuit 10. Current source 11 can be implemented as shown in subsequently described FIG. 4. The drain of transistor M1 is connected by conductor 3 to one terminal of capacitor C1, one terminal of switch S2, and one input of comparator 13. Similarly, the drain of transistor M2 is connected by conductor 4 to one terminal of capacitor C2, one terminal of switch S1, and one input of comparator 12. The other terminals of capacitors C1 and C2 are connected to ground. The other terminals of comparators 12 and 13 both are connected by conductor 5 to receive a first reference voltage Vref. Vref is produced by a reference voltage circuit including a current source Iref having one terminal connected to VCC and another terminal connected by conductor 5 to one terminal of a resistor 47, the other terminal of which is connected by conductor 24 to one terminal of a resistor 48. The other terminal of resistor 48 is connected to ground. The resistances of resistors 47 and 48 both are equal, for example, to one half the resistance of resistor R1 shown in Prior Art FIG. 1. Therefore, a second reference voltage equal to Vref/2 is produced on conductor 24.

The outputs of comparators 12 and 13 are connected by conductors 36 and 37 to corresponding inputs of OR gate 14. The output of OR gate 14 is connected to the clock input of flip-flop 15. (By way of definition, the logical function performed by either an OR gate or a NOR gate is referred to herein as an "ORing" function.) The output 16 of D-type flip-flop 15 is connected to the inputs of inverter 18 and non-inverting buffer 20 and also to an input of logic circuit 10. The output of inverter 18 is connected by conductor 19 to the input of D-type flip-flop 15. The output of buffer 20 produces the clock signal CLK, which is periodic at the frequency of relaxation oscillator 2. Logic circuit 10 can include simple logic circuitry that produces clock signals φ1, φ2, $\overline{φ1}$, and $\overline{φ2}$ in response to the signal produced on conductor 16 by the output of flip-flop 15. Clock signal $\overline{φ1}$ can be equal to φ2 and clock signal $\overline{φ2}$ can be equal to φ1.

Analog multiplier circuit 50 includes comparators 26 and 27 each having one input connected to conductor 24 to receive the second reference voltage Vref/2. The other input of comparator 26 is connected to V4 on conductor 4, and the other input of comparator 27 is connected to V3 on conductor 3. The output of comparator 26 is connected by conductor 38 to the clock input of a D-type flip-flop 31, and the output of comparator 27 is connected by conductor 39 to the clock input of a D-type flip-flop 30. The output of comparator 12 of relaxation oscillator 2 is connected by conductor 36 to the input of an inverter 22 of analog multiplier circuit 50, the output of which is connected by conductor 40 to a reset input of flip-flop 30. Similarly, the output of comparator 13 is connected by conductor 37 to the input of an inverter 21, the output of which is connected by conductor 41 to a reset input of flip-flop 31. The D inputs of flip-flops 30 and 31 are connected to VCC, and their outputs are connected to corresponding inputs of a OR gate 34, the output of which produces a clock signal CLK×2, the frequency of which is double the frequency of relaxation oscillator 2.

Figure 5:
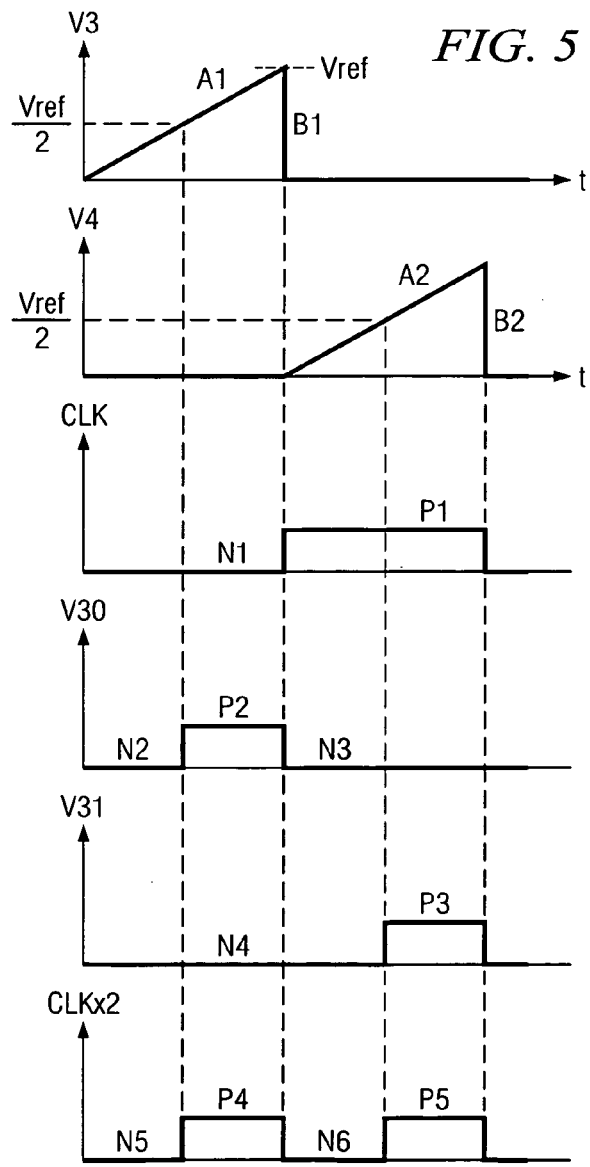
FIG. 5 is a timing diagram useful in explaining the operation of the clock signal generator circuit of FIG. 3.

Referring to FIGS. 3 and 5, the operation of relaxation oscillator 2 can be explained by assuming that initially φ1 is at a low level and φ2 is at a high level. Under these conditions, transistor M1 is on, transistor M2 is off, switch S1 is closed, and switch S2 is open. This causes the current I1 to flow through transistor M1 and gradually charge up capacitor C1, producing the ramp portion "A1" of voltage signal V3 as shown in FIG. 5.

When V3 exceeds the voltage Vref/2 on conductor 24, comparator 27 changes state and switches flip-flop 30 from a "0" logic level to a "1" logic level. This causes the voltage V30 to undergo a transition from level N2 to level P2 as shown in the timing diagram of FIG. 5. That causes OR gate 34 to produce the transition of the "doubled" clock signal CLK×2 from the level N5 to the level P4 in FIG. 5.

Then, when V3 increases enough to exceed Vref, the output 37 of comparator 13 switches from a "0" level to a "1" level, producing a "1" level at the output of OR gate 14, thereby causing flip-flop 15 to change state, for example from a "0" state to a "1" state. That causes non-inverting buffer 20 to produce the high level P1 of the "fundamental" clock output signal CLK produced by a relaxation oscillator 2 as shown in FIG. 5, and also causes inverter 18 of analog multiplier 50 to produce a "0" level at the D input of flip-flop 15, and causes logic circuit 10 to switch φ1 to a high level and switch φ2 to a low level.

That turns transistor M1 off, turns transistor M2 on, closes switch S2, and opens switch S1. The closing of switch S2 discharges capacitor C1, producing transition B1 of V3. The turning on of transistor M2 causes the current I1 to flow through transistor M2 and charges up capacitor C2, producing the ramp portion "A2" of the voltage V4. When V4 exceeds Vref/2, comparator 26 changes states and switches flip-flop 31 from a "0" level to a "1" level. This causes V31 to undergo a transition from the level N4 to level P3 as shown in the timing diagram of FIG. 5. That causes OR gate 34 to produce the transition of the "doubled" clock signal CLK×2 from the level N6 to the level P5 in FIG. 5.

Then, when V4 has further increased to exceed Vref, the output 36 of comparator 12 switches from a "0" level to a "1" level, producing a "1" level at the output of OR gate 14, thereby causing flip-flop 15 to change state, for example from a "1" state to a "0" state. That causes non-inverting buffer 20 to produce the low level of the "fundamental" clock output signal CLK produced by a relaxation oscillator 2, and also causes inverter 18 to produce a "1" level at the data input of flip-flop 15, and causes logic circuit 10 to switch φ1 to a low level and switch φ2 to a high level. The entire circuit operation process described above then is repeated.

Relaxation oscillator 2 in FIG. 3 operates the same as in Prior Art FIG. 1, and as the signals V3 and V4 ramp up and exceed the second reference voltage Vref/2, the additional comparators 26 and 27 in analog multiplier circuitry 50 switch states and correspondingly switch the states of flip-flops 31 and 30 half way through each of ramp portions "A1" and "A2" of signals V3 and V4. This causes OR gate 34 to double the frequency of clock signal CLK×2 without the need to double the frequency of relaxation oscillator 2.

It should be appreciated that in some relaxation oscillators the two ramp signals V3 and V4 are generated on a single conductor, rather than on the two conductors 3 and 4 as shown herein, and then are switched to the inputs of comparators 13 and 14, respectively.

Thus, the feedback loop including logic circuitry 10 and relaxation oscillator 2 of clock generator 100 continues to operate at its design frequency, while at the same time comparators 26 and 27, inverters 22 and 21, flip-flops 30 and 31, and OR gate 34 of analog multiplier circuit 50 operate to produce the "multiplied" clock signal CLK×2 with double the frequency of the "fundamental" clock signal CLK, which has the same frequency as relaxation oscillator 2.

The propagation delay Tprop through comparator 12 or 13, OR gate 14, flip-flop 15, and logic circuit 10 in FIG. 3 is the same as previously described with reference to Prior Art FIG. 1, and the percentage effect of a deviation in the value of Tprop on the period of CLK is the same as for the circuit of FIG. 1. However, the percentage effect of a deviation in Tprop on the period of the doubled frequency of clock signal CLK×2 produced by analog multiplier circuit 50 in FIG. 3 is reduced by a factor of 2 compared to the percentage effect that would occur on the period of the relaxation oscillator 2 if its frequency were to be doubled.

This is in contrast to the clock generator circuit 1 in prior art FIG. 1, wherein doubling the clock frequency of CLK would require doubling the frequency of the relaxation oscillator, and wherein the percentage effect of the normal deviations in Tprop on the deviation of the period of the doubled relaxation oscillator frequency would also be doubled.

Figure 6:
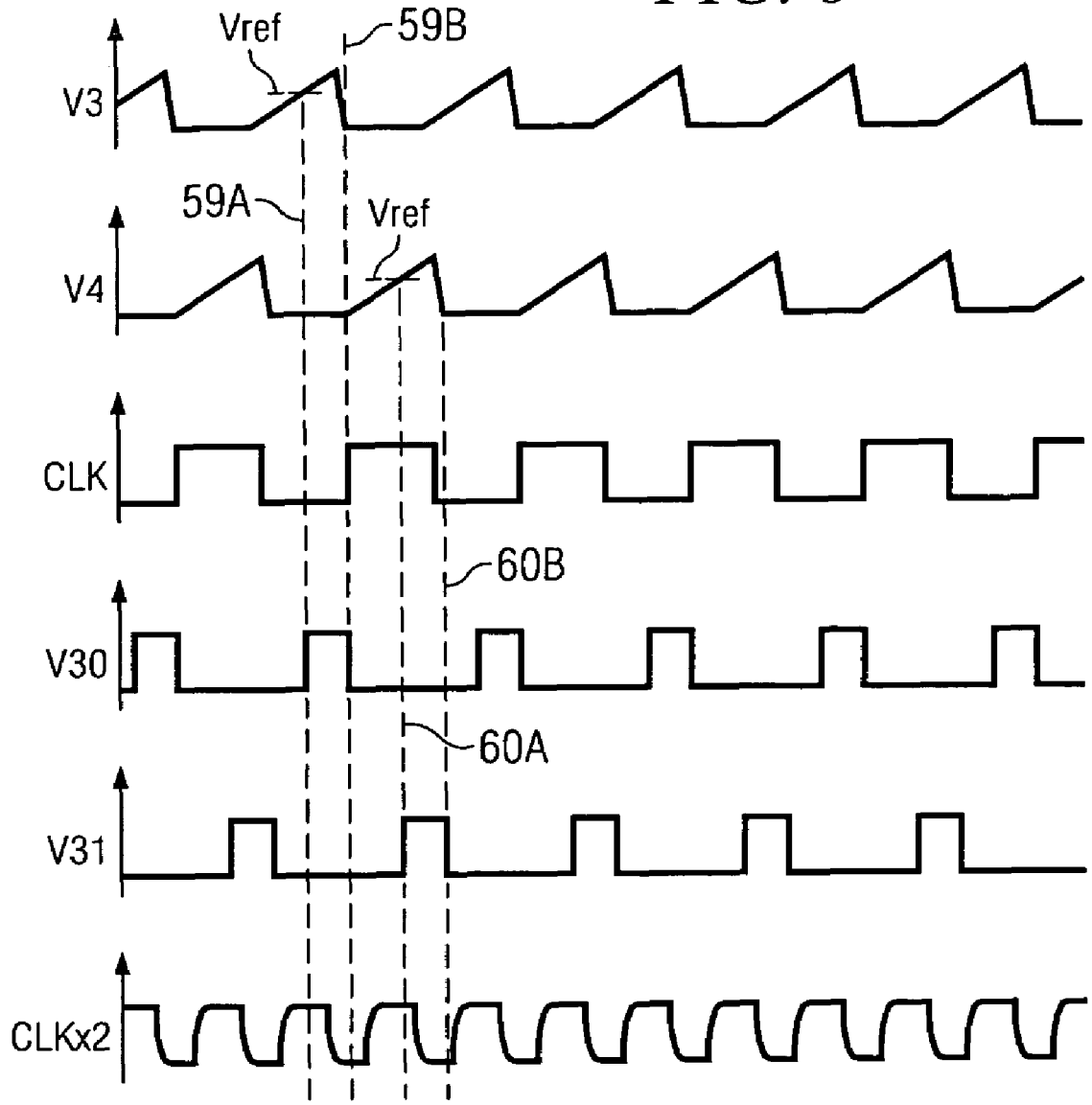
FIG. 6 is a timing diagram that is useful in further explaining the operation of the clock signal generator circuit of FIG. 3.

The timing diagram of FIG. 6 shows waveforms obtained from a simulation of the operation of FIG. 3. Waveforms V3 and V4 on conductors 3 and 4, respectively, are periodic at the relaxation oscillator frequency and are out of phase with each other by 180 degrees. The clock signal CLK therefore also is periodic at the relaxation oscillator frequency, and has rising edges which occur in response to the falling edges of V3 and falling edges which occur in response to the falling edges of V4. The signal V30 (produced by flip-flop 30) also is periodic at the relaxation oscillator frequency, and has rising edges which occur in response to switching of comparator 27 when it detects the condition that V3 exceeds Vref/2 (as indicated by dotted line 59A). V30 has falling edges which occur in response to comparator 12 when it detects that V4 is being discharged back to ground (as indicated by dotted line 59B). The signal V31 produced by flip-flop 31 also is periodic at the relaxation oscillator frequency, and has rising edges which occur in response to switching of comparator 26 when it detects the condition that V4 exceeds Vref/2 (as indicated by dotted line 60A). V31 has falling edges which occur in response to comparator 13 when it detects that V3 is being discharged back to ground (as indicated by dotted line 60B).

The "doubled" clock signal CLK×2 includes all of the pulses of V30 and V31 by virtue of the operation of OR gate 34, and therefore is periodic at double the relaxation oscillator frequency.

Figure 4:
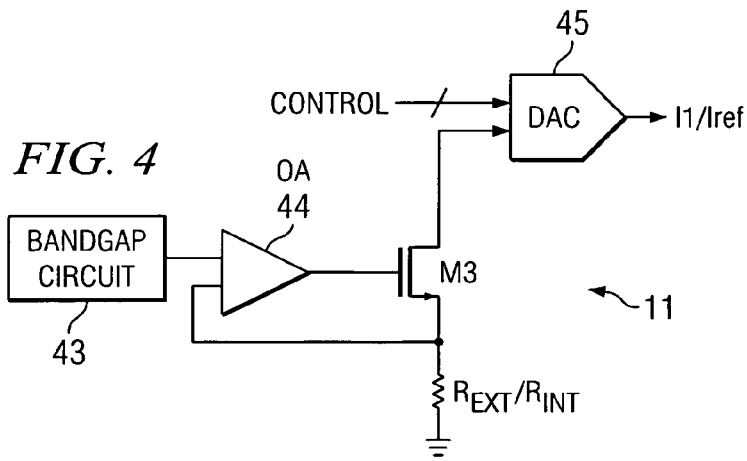
FIG. 4 illustrates a typical way of implementing the current source 11 in FIG. 3.

FIG. 4 shows the structure of a bandgap reference voltage circuit that can be used to generate both the current Iref and the current I1 in an on-chip resistor of the same type as resistors 47 and 48 in FIG. 3. The same bandgap reference voltage circuit 43 can be used to generate both currents. Referring to FIG. 4, a conventional bandgap circuit 43 provides an input to a voltage-to-current (V/I) converter 44, M3, and a resistor that can be either $R_{EXT}$ to generate I1 or $R_{INT}$ to generate Iref. The resulting current through transistor M3 can be provided as an input to corresponding current DAC 45. $R_{INT}$ is an internal resistor made of the same material as the resistors 47 and 48 in the reference voltage generating circuitry in FIG. 3. That allows matching of variations in I1 to variations in Vref and Vref/2.

Figure 7:
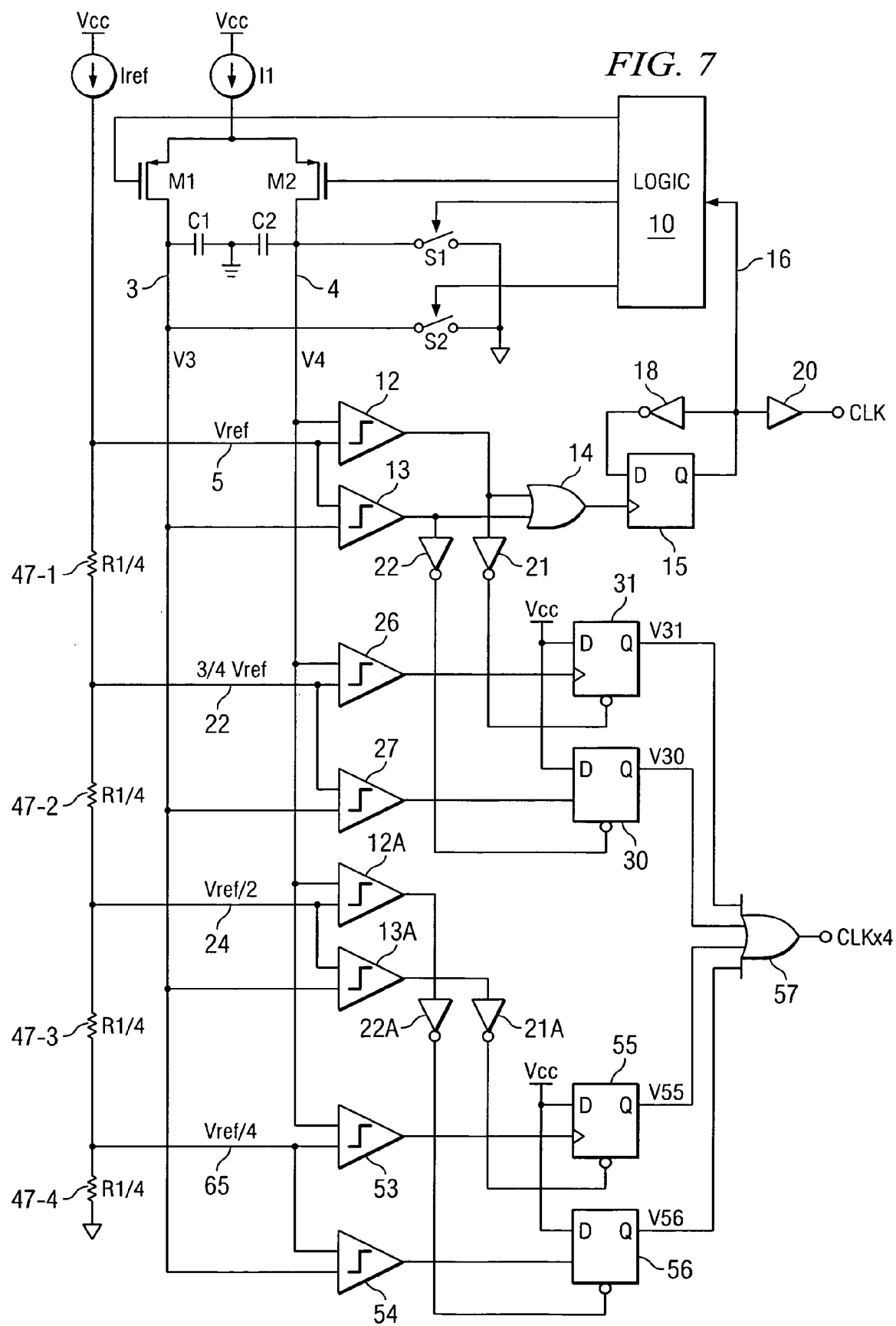
FIG. 7 is a block diagram illustrating a modification of the clock generator circuit of FIG. 3 to produce a clock output signal having a frequency 4 times the frequency of the relaxation oscillator.

FIG. 7 illustrates how clock generator circuit 100 of FIG. 3 can be modified to generate an output clock signal CLK×4 which is 4 times the relaxation oscillator frequency. The reference voltage generating circuit includes 4 equal resistors 47-1, 47-2, 47-3 and 47-4 of resistance R/4 connected in series between the reference current source Iref and ground to generate 4 reference voltages Vref, (¾)Vref,(½) Vref, and (¼)Vref on conductors 5, 22, 24, and 65, respectively. Conductor 5 is connected as shown in FIG. 3. Conductor 22 is connected to the inputs of comparators 26 and 27 as shown in FIG. 3. Conductor 65 is connected to one input of each of comparators 53 and 54, which are analogous to comparators 26 and 27 except that (¼)Vref is used instead of (¾)Vref. The outputs of comparators 53 and 54 are connected to the clock inputs of D-type flip-flops 55 and 56, respectively. Flip-flops 55 and 56 are analogous to flip-flops 31 and 30, respectively. The output voltages V55 and V56 are connected to inputs of OR gate 57, the other 2 inputs of which are connected to receive V30 and V31 produced by flip-flops 30 and 31. The reset inputs of flip-flops 55 and 56 are connected to inverters 22A and 21A, which are analogous to inverters 22 and 21, respectively. The inputs of inverters 21A and 22A are connected to the outputs of comparators 13A and 12A, respectively. One input of each of comparators 12A and 13A is connected to Vref/2, the other input of comparator 13A is connected to V3, and the other input of comparator 12A is connected to V4. Comparators 12A and 13A are analogous to comparators 12 and 13, respectively. The four pulses produced by flip-flops 30, 31, 55, and 56 therefore can be logically OR'ed by gate 57, resulting in the output signal CLK×4 with a frequency 4 times the relaxation oscillator frequency.

Thus, during each cycle of the relaxation oscillator a pulse is generated at the output of OR gate 57 corresponding to each of the 4 reference voltages (¼)Vref, (½)Vref, (¾)Vref, and, Vref, respectively. The same basic approach can be used to generate clock signals that are even higher multiples of the relaxation oscillator frequency. When V3 or V4 ramps up and crosses the Vref/4 threshold, a rising edge signal is generated by means of logic circuitry including OR gate 57 to contribute to the output clock signal CLK×4. When that voltage crosses the next threshold Vref/2, a falling edge event occurs. After the voltage crosses the next threshold (¾)Vref, another rising edge is generated, and after the voltage crosses Vref, a falling edge is generated.

The invention allows analog multiplying (for example, doubling) of the relaxation oscillator frequency to obtain the desired clock signal without having to increase the value of the relaxation oscillator current I1, wherein the amount of the bias current required by comparators 26 and 27, inverters 21 and 22, and flip-flops 30 and 31 and OR gate 34 may be substantially less than the total increase in the amount of current resulting from doubling the relaxation oscillator current I1, depending on the clock frequencies under consideration.

The analog techniques for multiplying the relaxation oscillator output frequency are achieved without compromising the precision of the frequency of the resulting clock signals over temperature. This is because the overall accuracy of clock generating circuit 100 is determined by the loop including transistors M1 and M2, comparators 12 and 13, OR gate 14, flip-flop 15, and logic circuit 10, and is independent of the relaxation oscillator frequency. If relaxation oscillator 2 is designed to operate at 10 MHz, the corresponding period $T_{OSC}$ of relaxation oscillator 2 is equal to 100 nanoseconds, so a 1 nanosecond deviation in the value of propagation delay Tprop results in a 1% deviation in the period of the fundamental clock signal CLK, and the percentage of corresponding deviation in the period of CLK×2 is the same. This is in contrast to the doubling of the percentage of frequency deviation that would occur if CLK×2 are obtained by simply doubling the frequency of relaxation oscillator 2.

The foregoing design is relatively independent of Vref variations in the bandgap voltage $V_{BG}$ produced by bandgap circuit 43. Both I1 and Vref are derived from $V_{BG}$ and voltage-to-current converter circuits as shown in FIG. 4. In previously mentioned Equation (1), $V_{BG}$ appears in both the numerator, since Vref=Iref*R1=($V_{BG}$/Rint)*R1, and in the denominator given that I1=$V_{BG}$/Rext*K1 where K1 is a scaling factor which can be achieved as shown in FIG. 4 with DAC 45. Thus $V_{BG}$ falls out of the transfer function. Note that the current I1, which charges up capacitors C1 and C2, is reduced if $V_{BG}$ is reduced. This slows the ramp-up times of V3 and V4. This effect is offset by the reduction in comparator target voltage Vref. The net result is the avoiding of a substantial change in frequency of relaxation oscillator 2.

The present technique allows use of a lower frequency relaxation oscillator cell and use of analog techniques to produce an output of 2 or more times the fundamental clock frequency of the relaxation oscillator with no degradation in performance relative to the performance of the fundamental frequency. This allows synthesizing of higher frequency clock signals using less power, and at lower cost, and provides precision of the frequency of the resulting clock signal equal to the frequency precision of the relaxation oscillator.

In some cases, the analog multiplier technique of the present invention can be used to multiply the relaxation oscillator frequency using less current and less power than would be required if the relaxation oscillator frequency were simply increased, depending on how much power the various comparators would require.

Another advantage of the clock generator circuitry of the present invention is that even though the current source I1 might need to be laser trimmed at the wafer level to achieve a nominal frequency of the relaxation oscillator, there might be substantial variations in Tprop over the expected temperature range, in which case being able to multiply the clock frequency without also multiplying the frequency variation due to variation of Tprop may be a significant benefit.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, although D-type flip-flops having a "clock" input are disclosed, other types of flip-flops could be used, with different kinds of inputs. By way of definition, an input of such a flip-flop that causes change or updating of the information or data stored in the flip-flop in response to a clock signal applied to that input is considered herein to be a "clock" input to the flip-flop even if it is an input of circuitry that is somewhat external to the basic flip-flop cell. Also, the term "resetting" of a flip-flop to a particular logic state is intended to have essentially the same meaning as "setting" a flip-flop to a particular logic state, since the voltage level represented by a particular logic state of the flip-flop is simply a matter of definition.

What is claimed is:

1. A signal generating circuit comprising:
   (a) a relaxation oscillator including switching circuitry operative to alternately generate a first ramp signal that is periodic at a frequency of the relaxation oscillator and a second ramp signal that is periodic at the frequency of the relaxation oscillator and is out of phase with respect to the first ramp signal; and
   (b) an analog multiplier circuit including
      i. a first comparator having a first input coupled to receive the first ramp signal and a second input coupled to receive a first reference voltage,
      ii. a second comparator having a first input coupled to receive the second ramp signal and a second input coupled to receive the first reference voltage,
      iii. a first flip-flop having a clock input coupled to an output of the first comparator,
      iv. a second flip-flop having a clock input coupled to an output of the second comparator,
      v. first reset circuitry for resetting the first flip-flop in response to a first level of the first ramp signal and second reset circuitry for resetting the second flip-flop in response to a second level of the second ramp signal, and
      vi. a gate circuit for performing a logical ORing function on an output of the first flip-flop and an output of the second flip-flop to produce an output signal that is periodic at a frequency that is a multiple of the frequency of the relaxation oscillator.

2. The signal generating circuit of claim 1 wherein the output signal is periodic at a frequency that is double the frequency of the relaxation oscillator.

3. The signal generating circuit of claim 1 wherein the relaxation oscillator includes a third comparator and a fourth comparator each having an input coupled to receive a second reference voltage, the third comparator having another input coupled to receive the first ramp signal and an output coupled to logic circuitry for controlling the switching circuitry, the fourth comparator having another input coupled to receive the second ramp signal and an output coupled to the logic circuitry, the first reset circuitry including the third comparator, the output of the third comparator being coupled to a reset input of the first flip-flop, the second reset circuitry including the fourth comparator, the output of the fourth comparator being coupled to a reset input of the second flip-flop.

4. The signal generating circuit of claim 3 wherein the output of the third comparator is coupled to the reset input of the first flip-flop by means of a first inverter, and wherein the output of the fourth comparator is coupled to the reset input of the second flip-flop by means of a second inverter.

5. The signal generating circuit of claim 4 wherein the first and second flip-flops are D-type flip-flops each having a reset input, and wherein an output of the first inverter is connected to the reset input of the first flip-flop and an output of the second inverter is connected to the reset input of the second first flip-flop.

6. The signal generating circuit of claim 3 wherein the relaxation oscillator includes first and second switching transistors each having a source coupled to a current source, a drain of the first switching transistor being coupled to a first conductor conducting the first ramp signal, and a drain of the second switching transistor being coupled to a second conductor conducting the second ramp signal, and wherein the logic circuitry produces first and second control signals which are out of phase with respect to each other, a gate of the first switching transistor being coupled to receive the first control signal, a gate of the second switching transistor being coupled to receive the second control signal.

7. The signal generating circuit of claim 6 wherein the relaxation oscillator includes a first switch coupled between the first conductor and a reference voltage conductor and a second switch coupled between the second conductor and the reference voltage conductor, and wherein the logic circuitry produces first and second logical complement control signals which are logical complements of the first and second control signals, respectively, a control electrode of the first switch being coupled to receive the second logical complement signal, and a control electrode of the second switch being coupled to receive the second logical complement control signal.

8. The signal generating circuit of claim 6 wherein the first and second switching transistors are P-channel transistors.

9. The signal generating circuit of claim 7 wherein the signal generating circuit is an integrated circuit, and wherein the current source includes a bandgap circuit having an output coupled to one input of a first operational amplifier, an output of the first operational amplifier being coupled to a gate of a first transistor having a having a source coupled to another input of the first operational amplifier and to one terminal of an external resistor having another terminal coupled to the reference voltage conductor, a drain of the first transistor being coupled to an analog input of a first current digital-to-analog converter, an output of which produces the current supplied by the current source.

10. The signal generating circuit of claim 9 including a reference voltage circuit including a reference current source, a first resistor having a first terminal coupled by a first reference voltage conductor to a terminal of the reference current source, and a second resistor having a first terminal coupled by a second reference voltage conductor to a second terminal of the first resistor and a second terminal coupled to the reference voltage conductor, the first reference voltage conductor conducting the second reference voltage conductor, the second reference voltage conductor conducting the first reference voltage, wherein the reference current source includes another bandgap circuit having an output coupled to one input of a second operational amplifier, an output of the second operational amplifier being coupled to a gate of a second transistor having a source coupled to another input of the second operational amplifier and to one terminal of an internal resistor having another terminal coupled to the reference voltage conductor, a drain of the second transistor being coupled to an analog input of a second current digital-to-analog converter, an output of which produces the current supplied by the reference current source.

11. The signal generating circuit of claim 1 wherein the analog multiplier circuit also includes
  i. a third comparator having a first input coupled to receive the first ramp signal and a second input coupled to receive a third reference voltage,
  ii. a fourth comparator having a first input coupled to receive the second ramp signal and a second input coupled to receive the third reference voltage,
  iii. a third flip-flop having a clock input coupled to an output of the third comparator,
  iv. a fourth flip-flop having a clock input coupled to an output of the fourth comparator, and
  v. third reset circuitry for resetting the third flip-flop in response to a third level of the first ramp signal and fourth reset circuitry for resetting the fourth flip-flop in response to a fourth level of the second ramp signal,
  vi. the gate circuit also performing the logical ORing function on an output of the third flip-flop and an output of the fourth flip-flop to produce an output signal that is periodic at a frequency that is 4 times the frequency of the relaxation oscillator.

12. A method of generating a signal having a frequency which is an integral multiple of a frequency of a relaxation oscillator, the method comprising:
  (a) operating the relaxation oscillator to alternately generate a first ramp signal that is periodic at a frequency of the relaxation oscillator and a second ramp signal that is periodic at the frequency of the relaxation oscillator and is out of phase with respect to the first ramp signal;
  (b) comparing the first ramp signal to a first reference voltage;
  (c) changing the state of a first flip-flop if the first ramp signal exceeds the first reference voltage;
  (d) comparing the second ramp signal to the first reference voltage;
  (e) changing the state of a second flip-flop if the second ramp signal exceeds the first reference voltage;
  (f) resetting the first flip-flop in response to a first level of the first ramp signal and resetting the second flip-flop in response to a second level of the second ramp signal; and
  (g) performing a logical ORing function on an output of the first flip-flop and an output of the second flip-flop to produce an output signal that is periodic at a frequency that is a multiple of the frequency of the relaxation oscillator.

13. The method of claim 12 wherein the output signal is periodic at a frequency that is double the frequency of the relaxation oscillator.

14. The method of claim 12 wherein the relaxation oscillator includes a first comparator and a second comparator each having an input coupled to receive a second reference voltage, the first comparator having another input coupled to receive the first ramp signal and an output coupled to logic circuitry for controlling the alternate generation of the first and second ramp signals, the second comparator having another input coupled to receive the second ramp signal and an output coupled to the logic circuitry, the method including resetting the first flip-flop in response to the output of the first comparator and resetting the second flip-flop in response to the output of the second comparator.

15. The method of claim 14 including connecting the output of the first comparator to a reset input of the first flip-flop by means of a first inverter, and including connecting the output of the fourth comparator to a reset input of the second flip-flop by means of a second inverter.

16. The method of claim 14 wherein the signal generating circuit is an integrated circuit, and wherein the method includes providing the current by applying a bandgap voltage produced by bandgap circuitry across an external resistor and directing a resulting current through an analog input of a first (current digital-to-analog converter) to cause it to produce the current supplied by the current source.

17. The method of claim 16 wherein the signal generating circuit includes a reference current source, a first resistor having a first terminal coupled by a first reference voltage conductor to a terminal of the reference current source, and a second resistor having a first terminal coupled by a second reference voltage conductor to a second terminal of the first resistor and a second terminal coupled to the reference voltage conductor, the first reference voltage conductor conducting the second reference voltage conductor, the second reference voltage conductor conducting the first reference voltage, the method including providing the reference current by applying the bandgap voltage across an internal resistor and directing a resulting current through an analog input of a second (current digital-to-analog converter) to cause it to produce the current supplied by the reference current source.

18. The method of claim 12 including:
  (1) comparing the first ramp signal to a third reference voltage;
  (2) changing the state of a third flip-flop if the first ramp signal exceeds the third reference voltage;
  (3) comparing the second ramp signal to the third reference voltage;
  (4) changing the state of a fourth flip-flop if the first ramp signal exceeds the third reference voltage;
  (5) resetting the third flip-flop in response to a third level of the first ramp signal and resetting the fourth flip-flop in response to a fourth level of the second ramp signal; and
  (6) performing the logical ORing function also on an output of the third flip-flop and an output of the fourth flip-flop to produce an output signal that is periodic at a frequency that is 4 times the frequency of the relaxation oscillator.

19. The method of claim 18 including performing step (1) before step (a) and performing step (3) before step (d).

20. A signal generating circuit comprising:
(a) a relaxation oscillator operating to alternately generate a first ramp signal that is periodic at a frequency of the relaxation oscillator and a second ramp signal that is periodic at the frequency of the relaxation oscillator and is out of phase with respect to the first ramp signal;
(b) means for comparing the first ramp signal to a first reference voltage;
(c) means for changing the state of a first flip-flop if the first ramp signal exceeds the first reference voltage;
(d) means for comparing the second ramp signal to the first reference voltage;
(e) means for changing the state of a second flip-flop if the second ramp signal exceeds the first reference voltage;
(f) means for resetting the first flip-flop in response to a first level of the first ramp signal and means for resetting the second flip-flop in response to a second level of the second ramp signal; and
(g) means for performing a logical ORing function on an output of the first flip-flop and an output of the second flip-flop to produce an output signal that is periodic at a frequency that is a multiple of the frequency of the relaxation oscillator.

* * * * *